United States Patent
Arabi et al.

(10) Patent No.: US 7,233,162 B2
(45) Date of Patent: Jun. 19, 2007

(54) ARRANGEMENTS HAVING IC VOLTAGE AND THERMAL RESISTANCE DESIGNATED ON A PER IC BASIS

(75) Inventors: Tawfik Arabi, Tigard, OR (US); Hung-Piao Ma, Portland, OR (US); Gregory M. Iovino, Hillsboro, OR (US); Shai Rotem, Hofit (IL); Avner Kornfeld, Zichron Yaakov (IL); Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/182,649

(22) Filed: Jul. 14, 2005

(65) Prior Publication Data

US 2005/0247605 A1 Nov. 10, 2005

Related U.S. Application Data

(63) Continuation of application No. 10/278,021, filed on Oct. 23, 2002, now Pat. No. 7,112,979.

(51) Int. Cl.
*G01R 31/26* (2006.01)
(52) U.S. Cl. .................... 324/765; 324/158.1
(58) Field of Classification Search ............. 324/158.1, 324/760–765; 209/571–576; 368/118–120; 714/724–733; 702/84, 117; 700/121
See application file for complete search history.

(56) References Cited

U.S. PATENT DOCUMENTS

| | | | |
|---|---|---|---|
| 4,639,664 A | * | 1/1987 | Chiu et al. .................. 324/73.1 |
| 4,875,002 A | | 10/1989 | Sakamoto et al. |
| 5,384,531 A | | 1/1995 | Yamazaki et al. |
| 5,574,853 A | * | 11/1996 | Barch et al. .................. 714/30 |
| 5,583,875 A | | 12/1996 | Weiss |
| 5,734,274 A | | 3/1998 | Gavish |
| 5,793,945 A | | 8/1998 | Tabata et al. |
| 5,923,602 A | | 7/1999 | Statovici et al. |

(Continued)

FOREIGN PATENT DOCUMENTS

EP 0 407 029 A2 1/1991

(Continued)

OTHER PUBLICATIONS

PCT Notification of Transmittal of The International Search Report or The Declaration for PCT Counterpart Application No. PCT/US03/33085 Containing International Search Report (Mar. 8, 2004).

*Primary Examiner*—Vinh P. Nguyen
(74) *Attorney, Agent, or Firm*—Blakely, Sokoloff, Taylor & Zafman LLP

(57) ABSTRACT

Systems for testing a plurality of integrated circuits at a plurality of frequencies and voltages is disclosed. In one embodiment, a plurality of integrated circuits is tested at least once within a predetermined set of combinations of frequencies and voltages. If the integrated circuit fails testing within any combination of a frequency and voltage within the predetermined set, the integrated circuit is retested at a different predetermined set of combinations of frequencies and voltages. If the integrated circuit fails testing within any combination of a frequency and voltage within the different predetermined set, the integrated circuit is discarded.

14 Claims, 5 Drawing Sheets

U.S. PATENT DOCUMENTS

| | | | |
|---|---|---|---|
| 5,973,541 A | 10/1999 | Rajivan et al. | |
| 6,112,940 A | 9/2000 | Canella | |
| 6,128,757 A | 10/2000 | Yousuf et al. | |
| 6,134,685 A | 10/2000 | Spano | |
| 6,326,800 B1 * | 12/2001 | Kirihata | 324/760 |
| 6,360,333 B1 | 3/2002 | Jansen et al. | |
| 6,365,859 B1 * | 4/2002 | Yi et al. | 209/573 |
| 6,430,705 B1 | 8/2002 | Wisor et al. | |
| 6,472,899 B2 | 10/2002 | Osburn et al. | |
| 6,625,758 B1 | 9/2003 | Singh | |
| 6,760,232 B2 * | 7/2004 | Smith et al. | 361/780 |
| 2002/0084798 A1 | 7/2002 | Osburn et al. | |

FOREIGN PATENT DOCUMENTS

| | | |
|---|---|---|
| EP | 0 715 176 A2 | 6/1996 |

* cited by examiner

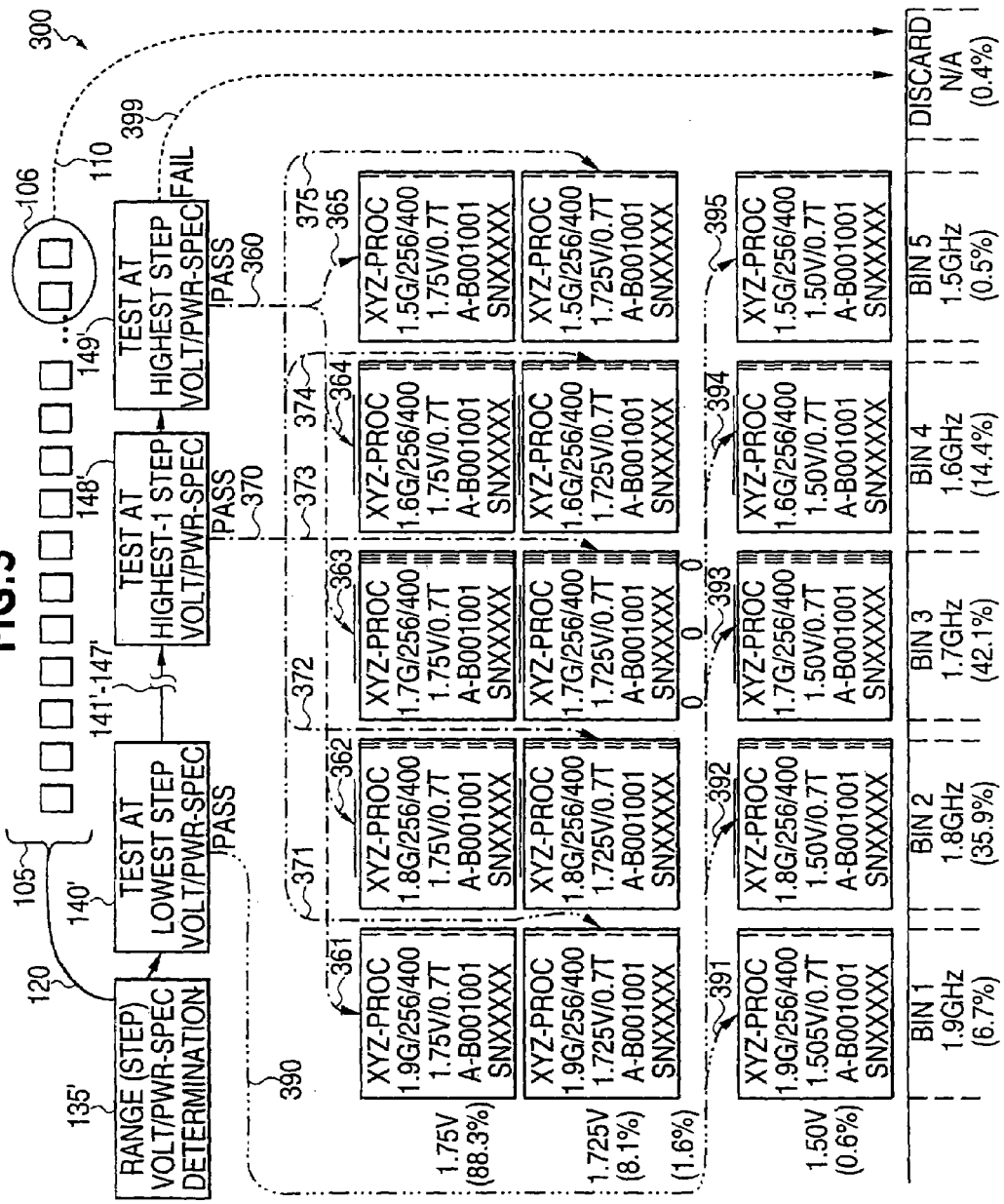

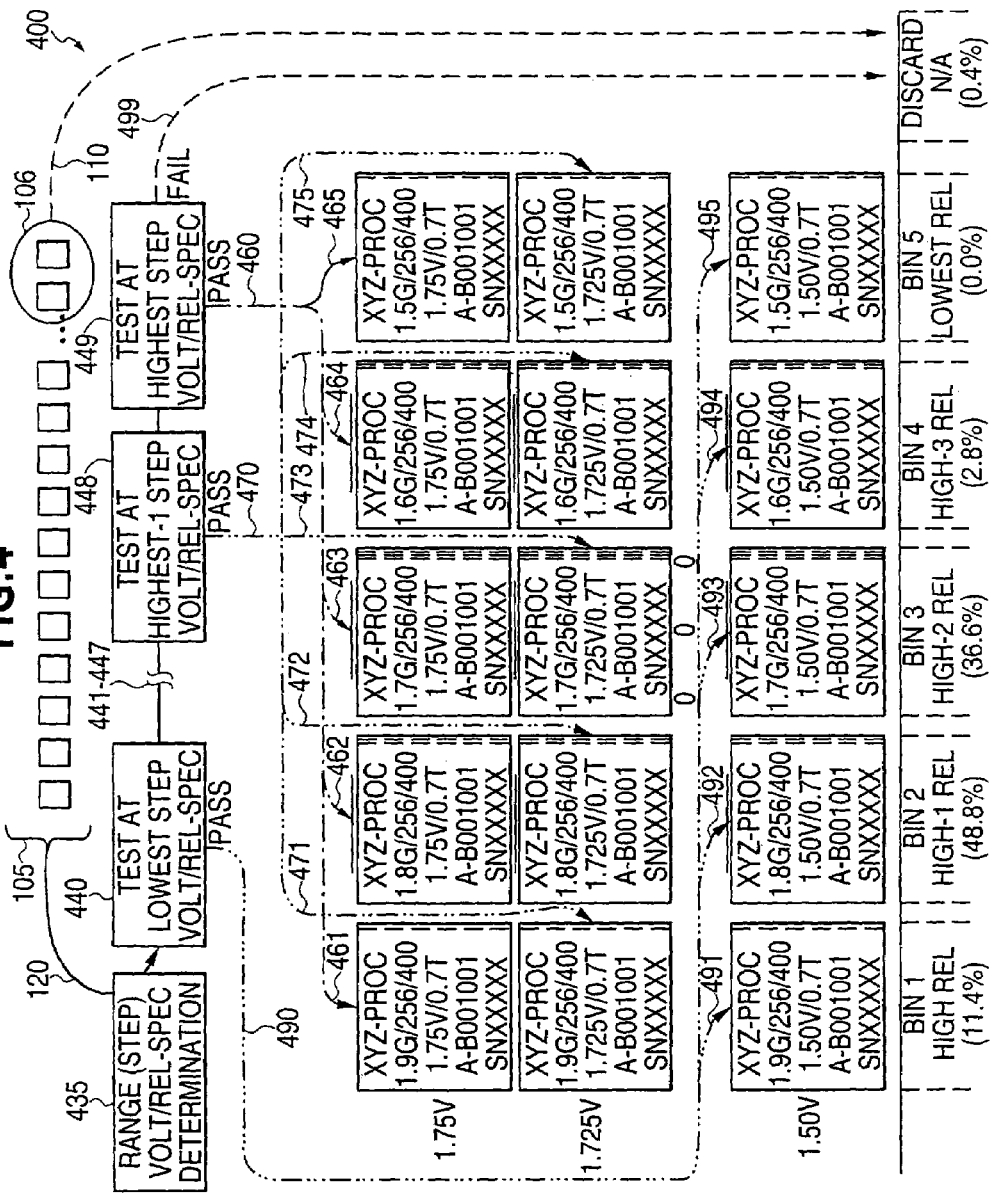

ARRANGEMENTS HAVING IC VOLTAGE AND THERMAL RESISTANCE DESIGNATED ON A PER IC BASIS

This is a Continuation Application of Ser. No.: 10/278,021 filed Oct. 23, 2002, now U.S. Pat. No. 7,112,979.

FIELD

Embodiments of the present invention relate to arrangements having integrated circuit (IC) voltage and thermal resistance designated on a per IC basis.

BACKGROUND

Background and example embodiments may be described using the context of processor IC die, chips, packages and systems, but practice of the present invention and a scope of the claims are not limited thereto.

In order to remain competitive in the marketplace, yields of semiconductor IC batches must continue to be improved. Improvements must also keep in mind that any overhead/work imposed on subsequent downstream consumers of the ICs must also be minimized or maintained within reasonable limits, in order to gain wide spread acceptance of the ICs.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIGS. 2-4 are first through third example (advantageous) testing flow and yield arrangements (embodiments) useful in gaining a more thorough understanding/appreciation of the present invention;

DETAILED DESCRIPTION

Figure 1:
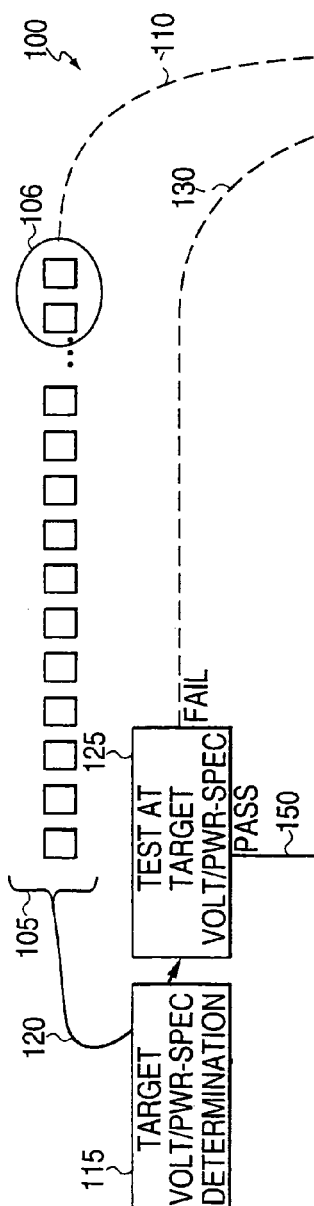
FIG. 1 is an example background (disadvantageous) testing flow and yield arrangement useful in gaining a more thorough understanding/appreciation of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges/yields may be given, although the present invention is not limited to the same. Well-known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the manufacturing, IC and/or testing platform within which the present invention is to be implemented, i.e., such specifics should be well within purview of one skilled in the art. Where specific details (e.g., circuits, flowcharts) are set forth in order to describe example embodiments of the invention, it should be apparent to one skilled in the art that the invention can be practiced without, or with variation of, these specific details. Finally, it should be apparent that differing combinations of hardware and software instructions can be used to implement embodiments of the present invention, i.e., the present invention is not limited to any specific combination of hardware and software.

Again, although disadvantageous and advantageous arrangements may be described using the context of processor IC die, chips, packages and systems, practice of the present invention and a scope of the claims are not limited thereto. That is, embodiments of the present invention may be equally applied in testing and yield improvement of other non-processor types of IC die, chips, packages, systems, etc.

Turning first to FIG. 1, FIG. 1 is an example background (disadvantageous) testing flow and yield arrangement 100 useful in gaining a more thorough understanding/appreciation of the present invention. More particularly, shown is a batch 105 of semiconductor ICs, for example, processor ICs. The term ICs is used generically in the present disclosure and claims to broadly mean semiconductor items that are at any of differing stages of manufacture, e.g., partially processed die stage, at a pre-packaging die stage, or at a post-packaging (chip) stage. A given batch may include hundreds, millions, and even tens or hundreds of millions of ICs.

Such batch may have been manufactured by the same entity (e.g., individual, partnership, corporation, etc.) that will perform subsequent testing (sometimes called "testing entity" or "tester", hereinafter), or alternatively may have been manufactured by a differing entity and obtained (e.g., purchased for redistribution) by the tester. The testing entity may perform testing in an attempt to guarantee a quality of the individual ICs, while at the same time trying to maximize saleable/useable yields of the batch 105.

Testing may be performed automatically (as opposed to manually), for example, by automated testing setups/machines. Testing of the ICs may be performed sequentially, in parallel, etc.

In anticipation of testing, the tester may set up a plurality of bins such as the FIG. 1 designated BIN1, BIN2, BIN3, BIN4, BIN5, DISCARD bins. While the FIG. 1 (and FIGS. 2-4) example(s) of the present disclosure utilizes five (5) example bins, practice of embodiments of the present invention broadly encompasses any number of bins. The bins may be set-up/partitioned/designated on a basis of any number of different parameters, and in the present FIG. 1 example, the various bins have been set up on a basis of reliable operational frequencies at which the ICs are capable of operating.

That is, the FIG. 1 (and FIGS. 2-3) example BIN1, BIN2, BIN3, BIN4, BIN5 bins have been set-up to receive ICs capable of being reliably operated at 1.9 GHz, 1.8 GHz, 1.7 GHz, 1.6 GHz and 1.5 GHz frequencies, respectively. Again, practice of embodiments of the present invention is not limited to such example frequencies. As a general rule, ICs operating at the highest frequency may be able to be sold for a higher commercial price than lower frequency ICs, and accordingly, the BIN1, BIN2, BIN3, BIN4, BIN5 bins of the present example have been arranged in an order of highest commercial value to lowest value from left to right.

Of course, the DISCARD bin is set up to receive ICs that are considered non-operational due to breakage, untestability, or testing failures, and hence the DISCARD bin has the FIG. 1 operational frequency designation of N/A (not applicable). ICs that are designated for or sent to the DISCARD bin are disadvantageously considered (for discussions of the present FIG. 1 example) to be of little or no value.

In further preparation of testing, testing guidelines/parameters may be determined for the batch to guide or set benchmarks for testing. As non-limiting/non-exhaustive examples, target voltage and power spec (i.e., specification) parameters may have been determined for the FIG. 1 example, such being shown representatively by the FIG. 1 block 115.

In the FIG. 1 example, the predetermined target voltage is consistently applied (without variation) to each and every testable IC, to determine whether that IC can operate properly at the target (i.e., expected Vcc) voltage. Testing respective ICs of a batch at differing (i.e., varying) target voltages (e.g., 1.75V, 1.725V, 1.70V, etc.) was not used/applied with the FIG. 1 testing arrangement, mainly because it is felt that testing respective ICs at numerous target voltages would require excessive testing time (thus slowing manufacturing, testing and delivery of the ICs to market), and further, it was felt that downstream users would not have accepted an IC inventory requiring mixed-voltages which in turn would have required an inventory of differing voltage supplies.

Turning next to determination of the exact target voltage that should be applied, the target voltage may be determined in any number of different ways. However, since a substantial portion of any IC's internal design/workings typically is maintained as a trade secret, determination of an appropriate testing target voltage is most easily/appropriately determinable by those skilled in the art who are most intimately involved with the internal design/workings of that IC, and is well within the purview of such skilled artisans.

As non-limiting/non-exhaustive examples, the target voltage may be a core voltage (Vcc) expected to be applied to the ICs during ultimate use thereof, and accordingly, the expected Vcc may be used as the testing voltage during testing. That is, the ICs may be designed and/or manufactured to operate at an expected core voltage (Vcc), and accordingly, the target voltage may be predetermined by the design at the design stage. Such expected target voltage may then be supplied by the designer, manufacturer and/or supplier of the untested (raw) IC batch 105 to the tester. Alternatively, the tester may perform some pre-testing of a small sampling of the untested ICs, and use the results from the pre-testing to determine/designate a target voltage which is expected to result in satisfactory batch testing and a satisfactory (PASS) yield.

One example target voltage is 1.75V, and such example voltage is adopted as the testing target voltage for the present FIG. 1 example. However, practice of embodiments of the present invention is not limited to such specific target voltage, or to having the target (testing) voltage exactly match the core (Vcc) voltage.

Turning next to determination of the target power spec, the power spec may be determined in any number of different ways. Any number of differing parameters and/or ranges may be set, depending upon many specifics such as the type of IC being tested, the environment in which the IC is to be implemented (e.g., consumer products, automotive, space, etc.), testing inputs/outputs available on the ICs, cooling arrangements which would be available within the marketplace for use with the IC, etc. Since a substantial portion of any IC's internal design/workings typically is maintained as a trade secret, determination of an appropriate testing power spec is most easily/appropriately determinable by those skilled in the art who are most intimately involved with the internal design/workings of that IC, and is well within the purview of such skilled artisans.

As a non-limiting/non-exhaustive example, the untested ICs may have been designed and/or manufactured to operate within a specific (predetermined) power spec, and accordingly, the power spec may be predetermined by the design at the design stage, and then supplied by the designer, manufacturer and/or supplier of the untested (raw) IC batch 105 to the tester. Alternatively, the tester may perform some pre-testing of a small sampling of the untested ICs, and use the results from the pre-testing to determine/designate a power spec which is expected to result in satisfactory batch testing and a satisfactory (PASS) yield.

For the FIG. 1 (and FIGS. 2-3) example(s), testing will look at, for example, a static (clock off) power, dynamic (clock on) power, and total (combination of static and dynamic) power. Again, practice of embodiments of the present invention is not limited to such example power spec and/or power measurements/types. An acceptable range may be set for each of these power types, and if an IC displays a power within the ranges during testing at the target voltage, then the IC may be considered a "PASS" for the given target voltage and power spec. Alternatively, if outside of range on any one of these power types during testing at the target voltage, then the IC may be considered a "FAIL".

Discussion continues with further description of the FIG. 1 example testing operation. As an initial note, even before testing is conducted, a certain portion 106 of the batch may be found (e.g., via physical inspection or scanning) unuseable/untestable at the onset, and may be designated for or sent to the DISCARD bin before testing (shown representatively by the short-dashed-line arrow 110). In the FIG. 1 example, this may represent, for example, 0.2% of the batch, and may be due to IC breakage or other types of mechanical defects.

A portion, majority or even an entire testable remainder (designated by the arrow 120) of hundreds, millions, and even tens or hundreds of millions of ICs of the batch 105 may then be subjected to testing at the target voltage and target power spec 115 at block 125. That is, at block 125, the actual testing is applied (e.g., at a suitable tester station/machine). A very large number of possible testing sequences may be able to be applied to each IC, even with the given target voltage and power spec. However, for sake of brevity and clarity, the FIG. 6 example testing sequence is assumed applied to the FIG. 1 (and FIGS. 2-4) example(s). Practice of embodiments of the present invention is not limited to such example testing sequence.

Figure 6:
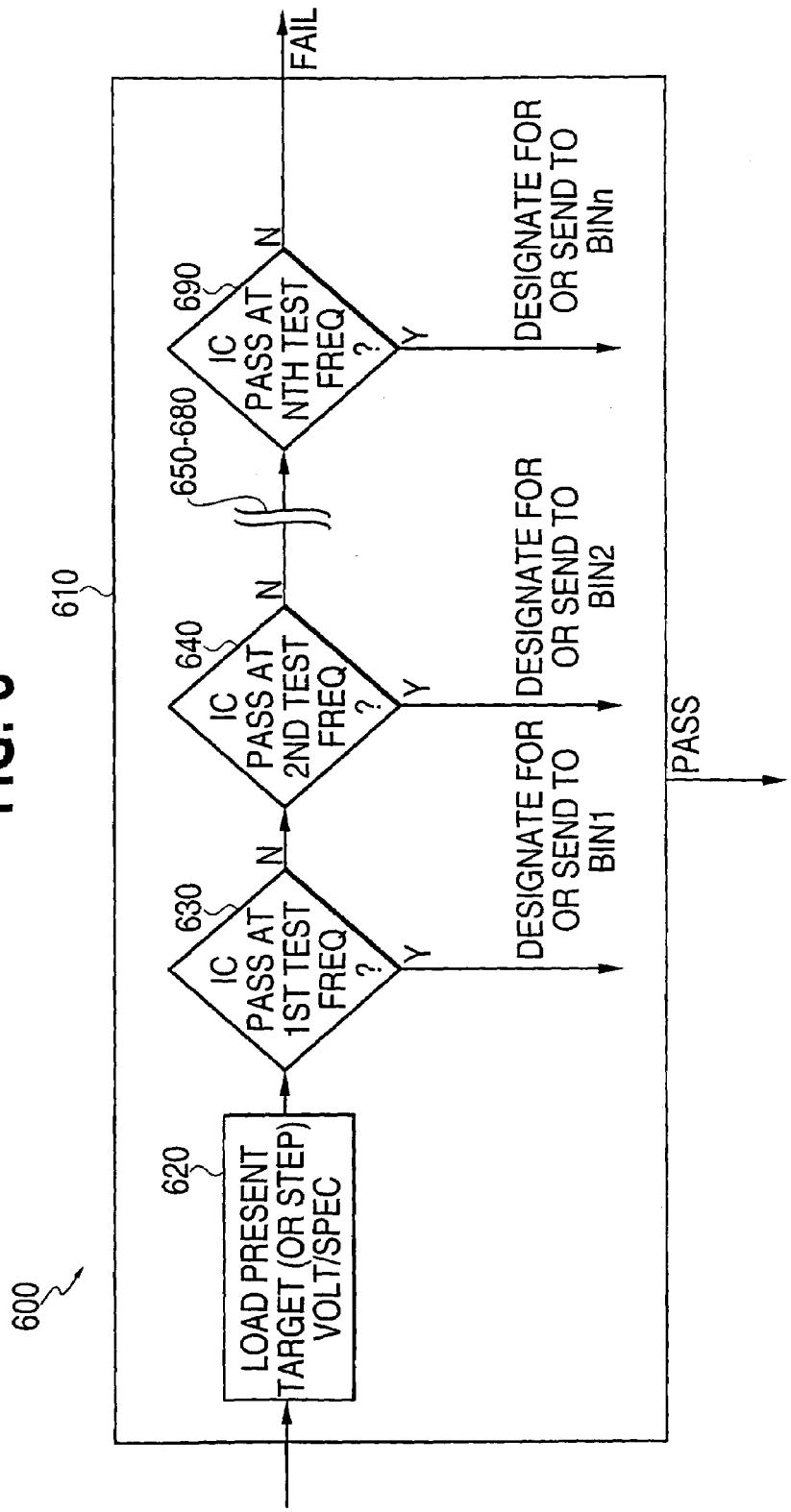
FIG. 6 is an example (advantageous) testing flow arrangement (embodiment) useful in gaining a more thorough understanding/appreciation of the present invention.

FIG. 6 is an example (advantageous) testing flow arrangement (embodiment) 600 useful in gaining a more thorough understanding/appreciation of the present invention. More particularly, within testing flow 610, first a present target voltage and spec (here a power spec) is loaded (block 620) into an automated testing apparatus. Next, testing of each subject IC is conducted at each testing frequency of interest (blocks 630-690). In the FIG. 6 example testing flow, it is assumed that each IC will be tested (block 630) first at the highest possible bin frequency (i.e., 1.9 GHz), and if necessary, retested at lower (block 640) and lower (blocks 650-690) bin (step) frequencies (shown representatively by the rightward N arrows) up until the IC achieves a PASS. Upon a pass, testing for that IC is finished, and the passed IC is distributed to the appropriate bin (shown representatively in FIG. 6 by the downward arrows from blocks 630-690, and representatively in FIGS. 1-4 by an IC being positioned over a bin). That is, if at any given time, a FIG. 1 IC receives a PASS, testing with respect to that IC may be considered completed, whereupon the IC can be immediately designated for or sent to the appropriate bin (i.e., without testing at any other lower frequency steps). Such helps to minimize an overall testing time needed to test the entire batch.

It is important to understand that any given IC may be able to PASS at a plurality of bin frequencies, e.g., an IC that passes at 1.8 GHz may also be able to pass at 1.7 GHz, 1.6 GHz and 1.5 GHz. The FIG. 1 arrangement of testing from highest to lowest frequency steps and distributing an IC upon first PASS, is advantageous in that it tends to pass/distribute an IC into its highest frequency (most commercially valuable) bin. Such arrangement tends to maximize a profit for the batch.

To initiate testing, the target voltage is applied to the IC. After a predetermined time (e.g., to allow the IC under test to stabilize thermally, electrically, etc.), the ICs' static (clock off) power is tested (at applicable ones of the differing frequency test blocks 630-690) to see whether it is within power spec range. In addition, the dynamic (clock on) power and/or total (combination of static and dynamic) power may also be tested at the subject frequency to see whether they are also within range. If the IC displays power readings within the ranges during testing at the subject 1.9 GHz, then the IC may be considered a "PASS" (shown representatively by the FIG. 1 solid line arrow 150) for the given target voltage and power spec, and that IC is designated for or sent to BIN1 (shown representatively by the solid line arrow 151).

Alternatively, if outside of range during testing at 1.9 GHz and at the target voltage, then the testing frequency may be reset to the next possible bin frequency (block 640), i.e., 1.8 GHz, and the IC retested. Again, if the IC displays a power within the power spec ranges during testing at 1.8 GHz, then the IC may be considered a "PASS" (shown representatively by the solid line arrow 150) for the given target voltage and power spec, and that IC is designated for or sent to BIN2 (shown representatively by the solid line arrow 152). If outside of range, retesting may be subsequently done at each of the lower-and-lower 1.7 GHz, 1.6 GHz, 1.5 GHz test frequencies (blocks 650-680) hoping for a "PASS, with any IC actually passing at 1.7 GHz, 1.6 GHz, 1.5 GHz being designated for or sent to the BIN3, BIN4, BIN5 bins, respectively (as shown representatively by the solid line arrows 153, 154, 155, respectively).

Alternatively, if outside of range during testing at the target voltage and all of the testing frequencies, then the IC may be considered a "FAIL", and may be destined for or sent to the DISCARD bin (shown representatively by the short-dashed-line arrow 130).

At the conclusion of testing, there may be a bin split distribution of the ICs for the bins, with the FIG. 1 example showing example distributions given within parenthesis at the bottom of such FIG., i.e., BIN1 (1.5%), BIN2 (24.0%), BIN3 (48.2%), BIN4 (21.8%), BIN5 (2.0%), DISCARD (2.5%). That is, with the present FIG. 1 example. as shown in parentheses to the left of the IC row, a total of 97/5% of the ICs ended up in or designated for the useable bin. It can be seen that a majority of the successfully tested ICs ended up in the BIN2, BIN3, BIN4 bins, with a highest concentration thereof being 48.2% distributed in BIN3. Further note that a total of 2.5% of the ICs ended up in the DISCARD bin and are considered (for purposes of the FIG. 1 example) disadvantageous waste.

That is, such damaged/failed ICs do not contribute to the yield derived from the batch 105, and may represent an economic loss. With the FIG. 1 example disadvantageous arrangement, the 2.5% discard was relatively low and was taken as an acceptable loss. Further, a perception associated with such FIG. 1 disadvantageous arrangement was that it would not be worth the time/cost to attempt salvage any of the discard ICs.

Returning discussion back to the successfully passed ICs, at some point in time (e.g., at the time of testing, or at a time downstream from the testing), each IC within a respective bin (of the FIGS. 1-4 examples) may receive appropriate descriptive and/or spec markings commensurate with the manufacturing thereof and the testing results. For example, directing attention and using the FIG. 1 IC 107 as an example, such IC may have, for example, five lines of information marked thereon.

A first line reading "XYZ-PROC" may designate the IC as a processor IC that is being distributed by the XYZ Corporation. A second line reading "1.9 GHz/256/400" may designate the processor as being reliably operable at processor speeds of up to 1.9 GHz, as having 256 Kbytes of internal cache memory, and as being reliably operable with bus speeds of up to 400 MHz. A third line reading "1.75V/73C" may designate that the IC is designated for use with 1.75 volt voltage supply, and a temperature of up to 73 degrees Celsius (to ensure correct and reliable thermal operation of the IC). A third line reading "A-B001001" may designate that the IC was produced at manufacturing plant A, and as part of batch (B) no. 001001. Finally, the last line reading "SNXXXXX" may designate a serial number of the IC. Practice of embodiments of the present invention is not limited to five lines of information, and is not limited to the above example descriptive and/or spec markings.

Of importance to note in FIG. 1, the second information line of the ICs within the differing bins are marked with differing reliable processor speeds. Further, note also that all of the ICs within the BIN1, BIN2, BIN3, BIN4, BIN5 bins are commonly marked with the same "1.75V" voltage designation.

A disadvantage of the FIG. 1 arrangement is that, while an acceptable yield may be achieved, the inventors of the present invention have performed significant research/analysis and have recognized that alternative testing arrangements applied to test the same manufacturing batch, may significantly improve yield, profit, etc. thereof. More particularly, the inventors have found that the FIG. 1 arrangement is disadvantageous in that it applies target voltage testing at only a single target voltage (i.e., a coarse granularity).

In their research/analysis, the inventors came to the conclusion that ICs (e.g., processor ICs) behave according to the following generalized power, reliability and performance equations:

| | |
|---|---|
| Fmax = f (Vcc, Temp, $V_t$, $L_{min}$) | (Eq. 1) |
| Power = f (Vcc, Temp, $V_t$, $L_{min}$) | (Eq. 2) |
| Rel = f (Vcc, Temp, $V_t$, $L_{min}$) | (Eq. 3) |
| $T_j = T_a + \theta_j P$ | (Eq. 4) |
| Power Delivery Impedance = (VID-V)/I = Z | (Eq. 5) | where: F is an operational frequency of the IC; f is a function; Vcc is a core voltage of the IC; $V_t$ is a threshold voltage of the on-IC transistors; $L_{min}$ is a gate length of the transistors of the IC; Rel is a reliability of the IC; $T_j$ is silicon junction temperature of the IC; $T_a$ is the ambient (system) temperature; $\theta_j$ is the thermal resistance at the silicon junction of the IC; P is power; VID is a voltage defined by a voltage identification arrangement internally in the IC; V is voltage; I is electrical current; and Z is electrical impedance from the voltage regulator to the IC.

The above example equations represent generalized equations applicable to most (if not all) ICs. As to specific equations applicable to a specific IC, since a substantial portion of any ICs' internal design/workings typically is maintained as a trade secret, determination of exact or approximation equations is most easily/appropriately determinable by those skilled in the art who are most intimately involved with the internal design/workings of that IC, and is well within the purview of such skilled artisans.

In turning now to apply the equations to further understanding of the present invention, since the present FIG. 1 example tests and splits the bins according to frequency, the present discussion will focus on the frequency Eq. 1. More particularly, Eq. 1 states that (at minimum) Fmax (i.e., a maximum operating frequency of an IC) is a function of Vcc, Temp, $V_t$, and $L_{min}$.

Of these four variables, $V_t$ and $L_{min}$ may be more adjustable during die design and manufacturing (i.e., semiconductor processing) stages, rather than at the testing stage. Further, Temp may be directly related to the frequency at which the IC is operated (i.e., higher frequencies generally producing a higher Temp). Accordingly, on a basis of the foregoing, the inventors recognized Vcc as a variable that may be most easily changeable/settable at the testing stage to influence/improve the testability (passing) and maximum operating frequency Fmax of an IC. Relatedly, the inventors noted that Vcc may also be the most easily changeable and settable variable within the other power and reliability equations (Eqs. 2 and 3) as well. Accordingly, Vcc will be used as the variable of interest in the discussions and example testing embodiments to follow.

Figure 2:
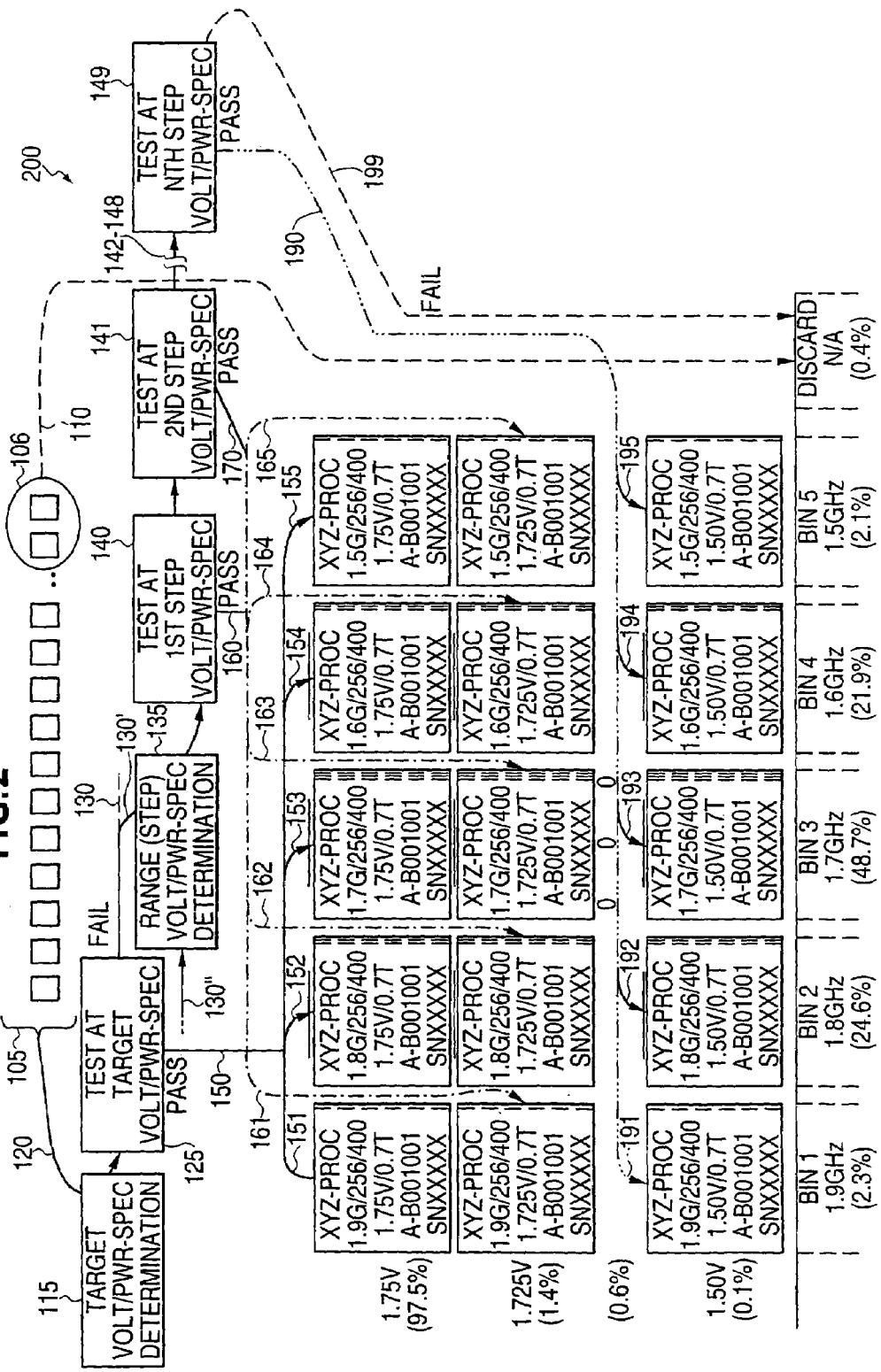

More particularly, testing was performed on wasted ICs from the FIG. 1 DISCARD bin, to determine whether a change in the testing target voltage (i.e., Vcc) could be used to redeem any of the DISCARD ICs. That is, FIG. 2 is a first example (advantageous) testing flow and yield arrangement (embodiment) 200 useful in gaining a more thorough understanding/appreciation of the present invention. For consistency and ease of comparison, FIG. 2 maintains the same FIG. 1 example bins.

As a first difference from FIG. 1, in addition to the single testing target voltage, additional predetermined testing voltage level steps may be determined which might be appropriate to apply to retest ones of the FIG. 1 DISCARD ICs. Determination of a range of voltage steps is shown representatively within FIG. 2 by block 135. Again, since a substantial portion of the IC's internal design/workings typically is maintained as a trade secret, determination of appropriate step target voltages is most easily/appropriately determinable by those skilled in the art who are most intimately involved with the internal design/workings of that IC, and is well within the purview of such skilled artisans. In the present FIG. 2 (and FIGS. 3-4) example(s), it was determined that it was appropriate to apply 25 mV steps, i.e., drop from the original 1.75V to step down to 1.725V, then 1.70V, etc., and finally ending testing at a 1.50V step. Again, practice of embodiments of the present invention is not limited to such example voltage step granularity, or the above specific voltage steps or range of steps.

It should also be noted that testing with the present FIG. 2 example required a differing respective power spec for each respective step target voltage. That is, as one example, a different testing power spec was applicable to ICs being tested at 1.725V as opposed to 1.75V. For example, ICs being operated at 1.725V will have a different viable static power range, dynamic power range, etc., than that being operated at 1.75V. Again, since a substantial portion of any IC's internal design/workings typically is maintained as a trade secret, determination of appropriate respective power specs associated with each of the step target voltages is most easily/appropriately determinable by those skilled in the art who are most intimately involved with the internal design/workings of that IC, and is well within the purview of such skilled artisans.

In the present FIG. 2 example, each of the different testing power specs again concerned static (clock off) power, dynamic (clock on) power, total (combination of static and dynamic) power, etc, with acceptable ranges being set for each of these power specs. If a DISCARD IC being tested at a step target voltage displays a power within the ranges of its corresponding power spec, then the IC may be considered a "PASS" for the given step target voltage and power spec. Alternatively, if outside of range during testing, then the IC may be considered a "FAIL".

Accordingly, continuing discussion of the FIG. 2 example, items similar to those of the FIG. 1 example are labeled with the same reference numerals, and redundant discussion thereof is omitted for sake of brevity. In addition to testing block 125 and its corresponding bin split flows to the BIN1, BIN2, BIN3, BIN4, BIN5 bins (shown representatively by the arrows 150-155), the FIG. 2 example has additional testing blocks 140-149, with their corresponding bin split flows (shown representatively by the arrows 160-165, 170- . . . and 190-195, respectively). The number of testing blocks may be any number (shown representatively by splice 142-148), and, for example, may correspond to a number of testing voltage level steps.

Previously passed ICs from FIG. 1 were not retested, and instead are shown in the top FIG. 2 IC row designated 1.75V (97.5%). Further horizontal rows of ICs have been provided below this top row and above the BIN1, BIN2, BIN3, BIN4, BIN5 and DISCARD bins, to further receive retested DISCARD ICs which may be subsequently found to PASS with testing at the additional step (Vcc) voltages. Such additional rows have been designated along a left-hand side of FIG. 2 as 1.725V, . . . , 1.50V.

In the retesting operation, DISCARD ICs from the FIG. 1 DISCARD bin were thus retrieved and applied (shown representatively by the dashed line arrow 130") to the additional testing blocks 140-149. Alternatively, rather than being discarded directly from the testing block 125 (shown representatively by the dashed line 130) and subsequently retrieved (shown representatively by the dashed line arrow 130"), unpassed ICs from the testing block 125 may be directly routed (shown representatively by the solid line arrow 130') from the testing block 125 to the additional testing blocks 140-149.

The same frequency step testing (FIG. 6) as was done with the testing block 125 is similarly performed for each of the additional testing blocks 140-149, except that the new voltage steps and their corresponding power specs are respectively applied. More particularly, in the FIG. 2 example, it is assumed that for testing block 140, an IC will be first tested at the highest possible bin frequency, i.e., 1.9

GHz. To initiate testing, the applicable step target voltage is applied to the IC (FIG. 6 block 630), and after a predetermined time (e.g., to allow the IC under test to stabilize thermally, electrically, etc.), the ICs' static (clock off) power is tested to see whether it reads within the corresponding power spec range. Subsequently, the dynamic (clock on) power and/or total (combination of static and dynamic) power may also be tested to see whether they are within range. If the IC displays a power within range during testing at 1.9 GHz and at the step target voltage, then the IC may be considered a "PASS" (shown representatively by the FIG. 2 long-/short-dashed arrow 160) for the given step target voltage and power spec. That IC may thus be designated for or sent to BIN1 (shown representatively by the long-/short-dashed arrow 161).

Alternatively, if outside of range during testing at 1.9 GHz and at the step target voltage, then the testing frequency may be reset to the next possible bin frequency, i.e., 1.8 GHz (FIG. 6 block 640), and the IC retested. Again, if the IC displays a power within the power spec ranges during testing at 1.8 GHz and at the step target voltage, then the IC may be considered a "PASS" (shown representatively by the long-/short-dashed arrow 160) for the given step target voltage and power spec, and thus be designated for or sent to BIN2 (shown representatively by the long-/short-dashed arrow 162). If outside of range, retesting may be subsequently done at each of the lower-and-lower 1.7 GHz, 1.6 GHz, 1.5 GHz test frequencies (FIG. 6 block 650f) hoping for a "PASS", with any ICs passing at 1.7 GHz, 1.6 GHz, 1.5 GHz being designated for or sent to the BIN3, BIN4, BIN5 bins, respectively (as shown representatively by the long-/short-dashed arrows 163, 164, 165, respectively).

If an IC fails to pass for the block 140 step voltage testing, retesting may be subsequently done at each of the lower-and-lower $2^{nd}$, $3^{rd}$, nth step voltages/power-specs with the testing blocks 141-149, with all of the 1.9 GHz-1.5 GHz test frequencies being applied at each decreasing step voltage, until a PASS is encountered. Passes from block 141 testing are shown, for example, representatively by pass output 170 (with bin distribution arrows thereof not being shown so as to avoid crowding), and passes from block 149 testing are shown, for example, representatively by the long-/multi-short dashed line 190-195.

At conclusion of testing, the retested ICs that have passed as a result of block 140, are shown as being arranged within a 1.725V row, and the retested ICs which have passed as a result of block 149, are shown as being arranged within a 1.50V row. Rows and ICs that were intermediate to these two 1.725V and 1.50V rows were not illustrated for sake of brevity/clarity. The percentage distribution of ICs within each row is shown in parenthesis along a left-hand side of each row. Note that 97.5% of the ICs which had previously passed via the FIGS. 1-2 testing block 125 at the 1.75V testing voltage are congregated within the 1.75V row, whereas the 2.1% of reclaimed DISCARD ICs are distributed within the other 1.725V, . . . 1.50 rows.

It should be noted at this point that it is not required that each and every one of the testing blocks 125 and 140-149 result in distribution of ICs therefrom to each and every one of the BIN1, BIN2, BIN3, BIN4, BIN5 bins. That is, any given testing block 125 and 140-149 may result in distribution to fewer than all of the bins, and may even result in distribution to none of the bins (for example, in a case where all retested ICs fail). To state it succinctly, the resultant bin distribution from any testing block is totally dependent on the PASSING of the tested ICs therefrom.

Continuing discussion, for any of the FIG. 2 retested ICs which is found to be outside of power spec range during testing at all of the step target voltages and all of the testing frequencies, then the IC may be considered a "FAIL". FAILED ICs may be designated for or sent to the DISCARD bin (shown representatively by the short-dashed-line arrow 199). Note that 0.4% of the total ICs still ended up in the DISCARD bin even after retesting, i.e., 0.2% represents the original untestable ICs (arrow 110), and 0.2% represents ICs that FAILED even upon the FIG. 2 retesting.

At the conclusion of testing, there may be an example bin split distribution of the ICs within the bins as shown in parenthesis at the bottom of FIG. 2. That is, while the FIG. 1 example had shown example distributions of: BIN1 (1.5%), BIN2 (24.0%), BIN3 (48.2%), BIN4 (21.8%), BIN5 (2.0%), DISCARD (2.5%), FIG. 2 shows significantly improved yield/distributions of BIN1 (2.3%), BIN2 (24.6%), BIN3 (48.7%), BIN4 (21.9%), BIN5 (2.1%), DISCARD (0.4%). That is, 2.1% of the original 2.5% DISCARD ICs have been reclaimed using the FIG. 2 example testing arrangement, with this reclaimed 2.1% of ICs being distributed as follows: BIN1 (+0.8%), BIN2 (+0.6%), BIN3 (+0.5%), BIN4 (+0.1%), BIN5 (+0.1%).

As it may be important to further understanding and appreciation of the invention, remember that it was previously stated that ICs operating at the highest frequency may be able to be sold for a higher commercial price than lower frequency ICs, and that the BIN1, BIN2, BIN3, BIN4, BIN5 bins have been arranged in an order of highest commercial value to lowest value from left to right. Accordingly, perhaps the most significant aspect to realize from the FIG. 2 example is that while all of the reclaimed 2.1% ICs represent increased yield/profit, a 1.4% majority of the reclaimed ICs end up reclaimed into the most valuable/profitable BIN1 and BIN2 bins. This is important and very advantageous because it may be very difficult to manufacture/achieve ICs that are operable at the BIN1 and BIN2 frequencies. With the present invention, in essence previous waste ICs have been reclaimed as ones of these difficult-to-achieve ICs, and have been turned into significant additional profits, simply by applying testing at additional lower testing voltage steps. That is, the previous low discard (2.5%) that was previously viewed as acceptable (with FIG. 1), may in fact contain some of the most valuable ICs within the batch.

Once the FIG. 2 testing has been completed, at some point in time (e.g., at the time of testing, or at a time downstream from the testing), each IC within a respective bin may receive appropriate descriptive and/or spec markings commensurate with the manufacturing thereof and the testing results. For sake of brevity, the FIG. 2 (and FIGS. 3-4) passed ICs are marked with similar information as that of the FIG. 1 ICs having five lines of information marked thereon. However, as one important difference, note that while the FIG. 1 ICs are all commonly marked/destined for operation at 1.75V (i.e., Vcc), the FIG. 2 (and FIGS. 3-4) ICs are diversely marked/destined for operation at a number of differing voltages, i.e., some ICs are designated to be operated at the original 1.75V, some at 1.725V, some at 1.70V, etc., all the way down to the example 1.50V. The greater the granularity of testing voltage steps, the more diversely the ICs inventory will be marked.

As another important difference, note that the FIG. 2 (and FIGS. 3-4) ICs are no longer marked with a designated temperature, but instead, are marked with a thermal resistance (or impedance) "T" value. That is, a third line may instead, for example, be marked to read "1.725V/0.7T" which may designate that the IC is designated for use with 1.725 volt voltage supply, and any cooling arrangement/ design (e.g., heat sink) used in conjunction with the IC should take into consideration that the IC is designated with a 0.7 thermal resistance. The thermal resistance is also sometimes referred to as "$\theta_{ja}$", where $\theta_{ja}$ is the thermal resistance of the thermal path between the silicon junction of the IC and the ambient environment (e.g., air) surrounding the IC. Research/analysis leading to the present invention had shown that there is one optimal (Vcc, Temp, $V_t$, $L_{min}$) that maximizes performance for a given cost ($\theta_{ja}$), and accordingly, it appeared appropriate to designate thermal resistance as T or $\theta_{ja}$ (rather than temperature) with the designated optimal Vcc.

One potential disadvantage of the FIG. 2 and other (FIGS. 3-4) embodiments (discussed ahead) is that a diverse or elaborate inventory of ICs designated for differing Vcc voltages may (if not managed properly) impose additional overhead/work on downstream consumers of the ICs (e.g., original equipment manufacturers (OEMs)). More particularly, as mentioned previously, any overhead/work imposed on subsequent downstream consumers of the improved yield ICs must be minimized or maintained within reasonable limits in order to gain wide spread acceptance of the ICs. For example, if the OEMs were faced with obtaining and maintaining an elaborate/diverse/expensive inventory of diverse voltage/power supplies which mirrored the diverse voltage (Vcc) requirements of the differing ICs, then the OEMs may very well shun/avoid the ICs, thereby preventing widespread acceptance of the same.

However, a solution which avoids this potential problem is available, in that automatically adjustable voltage regulator modules (VRMs) have recently gained popularity in the industry. More particularly, a VRM may be a DC-DC converter that automatically senses voltage designation information from the IC, and on a basis of the sensed information, automatically supplies the correct voltage and current to the IC without any further intervention required of the OEM. The ICs of the present invention may be used with VRMs. Thus, the OEM may be able to obtain/maintain only a single inventory of adjustable VRMs, rather than a diverse inventory of voltage/power supplies, and hence the above-mentioned potential disadvantage of the present invention is minimized.

As to particulars of implementing a VRM with an IC of the present invention, there is a plurality of different ways in which the VRM might be able to automatically sense the voltage designation information. More particularly, attention is momentarily directed to FIG. 5 which is an example processor system embodiment 500 useful in gaining a more thorough understanding/appreciation of further features of embodiments of the present invention. Shown is an example processor enabled system 505 having one or more processors 510 which may be part of a processor package 520 that may include a VRM 530. The system 505 may further include a printed circuit board (PCB) 540 (for example, a motherboard), a connector 550 and an input/output device 560.

As a first example of a way to implement the VRM, each IC which achieves a pass upon testing may have an internal voltage identification (VID) arrangement electrically set (e.g., via blowing of appropriate internal electrical fuses) so as to contain an internal electrical designation of its designated Vcc voltage. Thus, a Vcc voltage designated for delivery to the IC would be selected by the value encoded on the VID arrangement and readable via pin connections of the IC. Alternatively, a designated Vcc voltage may instead be programmed with package routing, but routing is more difficult to implement than fusing. At the end of testing and VID programming, same line item parts from a same stepping (batch) and a same frequency would then have different VID settings fused or routed therein. That is, each IC would have internal preprogramming to have VCC selected by the encoded VID value.

The VRM then might be able to automatically sense the VID by being electrically connected to the processor 510 by a plurality of voltage identification (VID) electrical lines (shown representatively by the FIG. 5 arrow 591), and by being able to sense/read a combination of opens/shorts on such lines. For example there may be five (5) VID lines, and various combinations of 1's and 0's on the lines may designate the appropriate Vcc voltage for the IC. As one example, "00101" may designate the 1.725V required by the FIG. 5 example processor 510.

As another alternative to sense voltage designation information, the VRM may be equipped with an optical and/or magnetic scanning arrangement, wherein the VRM is able to automatically scan (shown representatively by the FIG. 5 arrow 592) the voltage designation information written on an outside of the IC (e.g., in reflective ink, magnetic ink, etc.). That is, external readable information may be written as readable graphical (e.g., alphanumeric) characters, symbols, bar coded information, etc. As another example, the VRM might be equipped to receive/read electromagnetic transmission information (shown representatively by the FIG. 5 lightning bolt 593) transmitted from a nominally powered IC.

Figure 5:
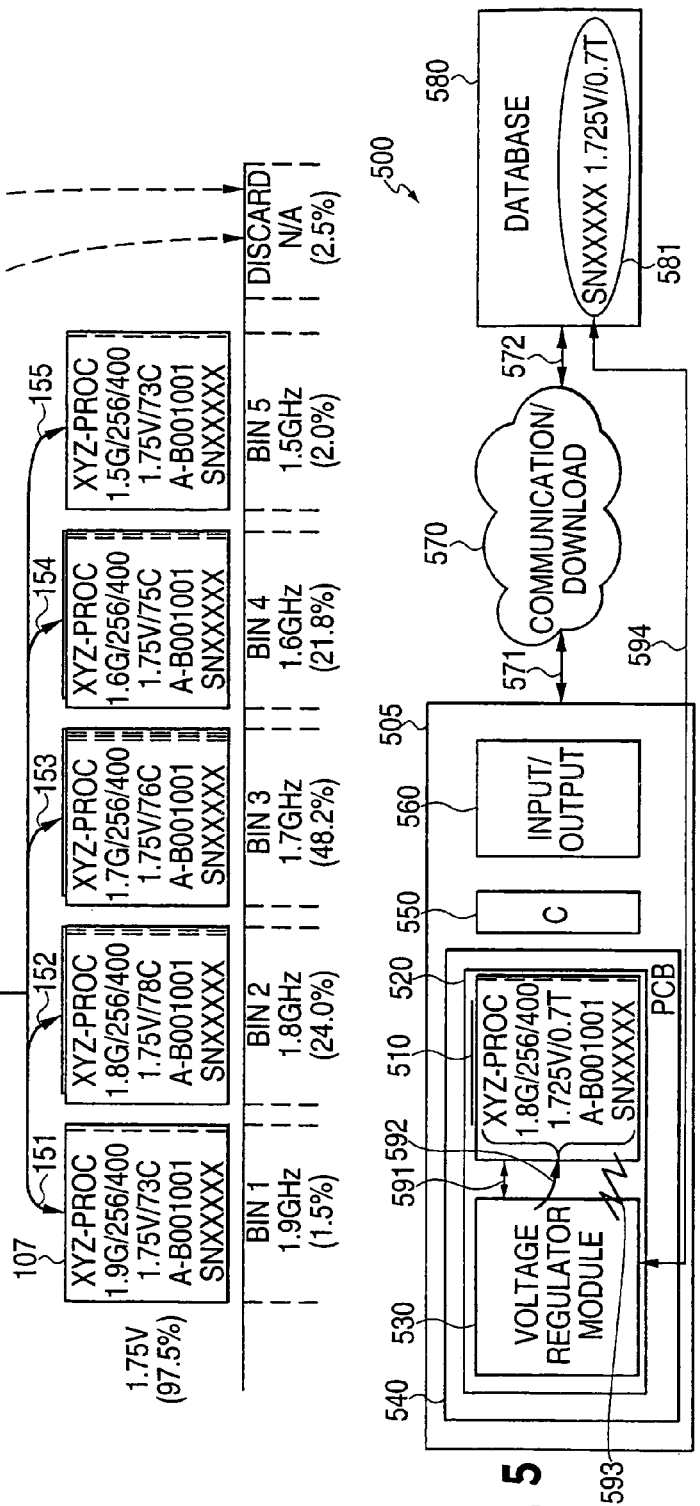
FIG. 5 is an example processor system embodiment useful in gaining a more thorough understanding/appreciation of further features of embodiments of the present invention.

As still a further alternative, the voltage designation information may be able to be stored/retrieved remotely from the IC. More particularly, FIG. 5 further shows a remote database 580 (e.g., maintained at the IC's outsourcing XYZ Corporation) which may contain a table which cross-references IC serial numbers to corresponding voltage designation (and other) information. Accordingly, the database 580 may contain entry 581 containing information corresponding to the processor 510, i.e., as an example, FIG. 5 illustrates this entry 581 as containing the information "SNXXXXX 1.725V/0.7T".

To sense such remote entry 581, the processor enabled system 505 may be constructed to first power up nominally from the VRM using a predetermined safe nominal voltage sufficient to make the system at least marginally operable, and thereafter, the VRM 530 and/or processor 510 may retrieve (shown representatively by the FIG. 5 two-headed arrow 594) using a communication/download 570 via communications 571, 172. One example would be retrieving such information via an Internet download. Once the voltage designation information has been remotely retrieved, the VRM 530 may thereafter automatically fully power up the processor 510 from the nominal voltage up to the proper designated voltage (i.e., Vcc).

As to the industry acceptance of the change in the on-IC designation of thermal resistance instead of temperature, it is felt that the adjustment to thermal resistance designations represents little or reasonable overhead/work imposed on subsequent downstream consumers (e.g., OEMs), and accordingly, should not be an impediment to wide spread acceptance of such ICs.

Another potential disadvantage of the FIG. 2 and other embodiments (discussed ahead) is that additional testing time is required. However, one example estimate has found the step testing would only take 100 msec per IC unit per iteration. Such was felt reasonable/acceptable testing penalty, especially in view of significant return value/profit resultant from reclaiming ICs to valued bins.

Discussion turns next to another example embodiment of the present invention. More particularly, FIG. 3 is a second example (advantageous) testing flow and yield arrangement (embodiment) 300 useful in gaining further understanding/appreciation of the present invention. While the FIG. 2 example embodiment focuses on simply reclaiming discarded ICs, the FIG. 3 example embodiment focuses on applying the step target voltage testing to all ICs (i.e., each and every IC) in an attempt to further improve yield, profit, etc. Thus, the FIG. 3 arrangement proposes to designate a variable (step) voltage and/or thermal resistance on a per IC basis.

More particularly note, in comparing FIG. 2 and FIG. 3, that the original target volt/pwr-spec block 115 and target testing block 125 have been instead incorporated into a range (step) volt/pwr-spec determination block 135', and that that the plurality of step testing blocks 140'-149' are used to test each IC of the portion, majority or even entire testable remainder 120 of the testable ICs of the batch 105. Testing block 140' results in passes/distributions 390-395, testing block 148' results in passes/distributions 370-375, and testing block 149' results in passes/distributions 360-365. Again, for any ICs which is found to be outside of power spec range during testing at all of the step target voltages and all of the testing frequencies, then the ICs may be considered a "FAIL", and may be designated for or sent to the DISCARD bin (shown representatively by the short-dashed-line arrow 399).

As one important difference, note that while the FIG. 2 example arrangement was arranged to generally test from the highest possible step voltage toward the lowest, the FIG. 3 example arrangement oppositely tests from lowest possible step voltage (block 140') toward the highest (block 149'). Such may be further advantageous over the FIG. 2 testing from highest to lowest.

More particularly, previously it was mentioned that the BIN1, BIN2, BIN3, BIN4, BIN5 bins of the present example have been arranged in an order of highest commercial value to lowest value from left column to right, i.e., higher frequency ICs (left column) selling for a higher price than lower frequency ICs (right columns). This type of commercial value analysis can likewise be extended to the operating (Vcc) voltage.

That is, since, as a general rule, ICs operating at lower Vcc voltages may be able to be sold for a higher commercial price than ICs operating at higher Vcc voltages (and at the same frequency), the rows 1.75V, 1.725V, . . . , 1.50V of the present example have been arranged in an order of lowest commercial value at the top 1.75 volt row, to the highest commercial value at the bottom 1.50V row. Thus, overall within the FIG. 3 array of ICs, the lowest and left-most ICs in FIG. 3 IC distribution array may have the highest commercial value, whereas the highest and right-most ICs have the lowest commercial value. Thus, a goal to increase profits would be to place/move more ICs toward the lowest, left-most row/bins.

Testing from lowest step voltage to highest is advantageous in that it tends to pass/distribute ICs into the lowest step (Vcc) voltage (i.e., the most commercially valuable) bins, i.e., testing and binning upon first pass is biased to distribute ICs into the lowest (most valuable) row, and left-most (most valuable) bins. That is, if a given IC is able to pass at plurality of differing step voltages such as 1.725V, 1.70V, . . . , 1.50V, testing this IC at the lowest 1.50V step voltage first and then ending testing and distributing upon a first PASS, would result in the IC being designated for or sent to the 1.50V row (as opposed to the other less commercially valuable rows).

At the conclusion of testing, there may be an example bin split distribution of the ICs within the bins as shown in parenthesis at the bottom of FIG. 3. That is, while the FIG. 1 example had shown example distributions of: BIN1 (1.5%), BIN2 (24.0%), BIN3 (48.2%), BIN4 (21.8%), BIN5 (2.0%), DISCARD (2.5%), and FIG. 2 had shown significantly improved yield/distributions of BIN1 (2.3%), BIN2 (24.6%), BIN3 (48.7%), BIN4 (21.9%), BIN5 (2.1%), DISCARD (0.4%), FIG. 3 shows even further significantly improved bin distributions of BIN1 (6.7%), BIN2 (35.9%), BIN3 (42.1%), BIN4 (14.4%), BIN5 (0.5%), DISCARD (0.4%). Further, while FIG. 2 showed row distributions of 1.75V (97.5%),1.725V (1.4%), . . . , (0.6%), . . . , 1.50V (0.1%), FIG. 3 shows even further significantly improved row distributions of 1.75V (88.3%), 1.725V (8.1%), . . . , (1.6%), . . . , 1.50V (0.6%). That is, whereas the yield (99.6%) stayed the same from FIG. 2 to FIG. 3, the FIG. 3 testing arrangement more optimally redistributed some (ones) of the yield ICs from less valuable rows/bins into lower more valuable rows, and into left-ward more valuable bins. Hence, an overall profit will have been significantly improved.

In addition to an up-front increase in profits, redistributing of ICs from higher to lower voltage bins may also result in higher possible frequencies (for a given cooling arrangement), or a further increase in profits downstream. More particularly, as to higher possible frequencies, a maximum operating frequency of an IC is often limited by a cooling capacity of an available cooling arrangement (i.e., where thermal breakdown will occur). If less heat is generated as a result of a lesser Vcc voltage being applied to an IC, then additional (unused) cooling capacity becomes available for other uses. As one example, the additional (i.e., regained) cooling capacity may be able to be used to increase the IC's operational frequency (which typically causes increased heat generation). That is, because less voltage watts have to be dissipated, more frequency watts may be dissipated across the given cooling arrangement (e.g., heat sink), and there may be achieved a higher frequency IC.

As to a possible further downstream increase in profits, if less heat is generated, less has to be dissipated by the cooling arrangement (at the same frequency). If less cooling is required, then a lower cost cooling arrangement may be able to be implemented (with the same frequency), resulting in higher profits for a boxed IC manufacturer or assembling OEM.

Discussions turn finally to a final FIG. 4 example. More particularly, FIG. 4 is a third (advantageous) example testing flow and yield arrangement (embodiment) 400 useful in gaining further understanding/appreciation of the present invention. While the FIGS. 1-3 example embodiments focused on testing on a basis of power specs, FIG. 4 focuses on another example alternative that instead focuses on testing on a basis of IC reliability.

More particularly, ICs are sometimes bin-sorted/valued/sold on a basis of reliability specs as opposed to power specs. Thus, FIG. 4 is concerned with testing according to the above mentioned reliability equation, i.e.:

$$Rel = f(Vcc, \text{Temp}, V_t L_{min}) \qquad \text{(Eq. 3)}$$

Note that just like the previously used Fmax equation, Vcc is a viable parameter to vary at testing time in an attempt to improve pass-ability, yield and profit in the testing of an IC batch.

As a prelude to the reliability testing, predetermined testing voltage level steps and reliability specs may be determined which might be appropriate to apply to the ICs. Such is shown representatively by the FIG. 4 block 435. For sake of consistency with other examples/FIGs., in the present FIG. 4 example arrangement, it is again assumed that it is appropriate to test between 1.50V and 1.75V in 25 mV steps.

As to determination of appropriate reliability specs, since a substantial portion of any IC's internal design/workings typically is maintained as a trade secret, again, determination of appropriate step target voltages and reliability specs for reliability testing is most easily/appropriately determinable by those skilled in the art who are most intimately involved with the internal design/workings of that IC, and is well within the purview of such skilled artisans. As one non-limiting, non-exhaustive example, a reliability spec/determination may look at a number of expected hours before IC failure is expected to occur. It should also be noted that similar to the FIGS. 2-3 examples, testing with the present FIG. 4 example may also require a differing reliability spec for each respective step target voltage.

Upon testing, if a FIG. 4 IC being tested at a step target voltage displays reliability within the ranges of its corresponding reliability spec, then the IC may be considered a "PASS" for the given step target voltage and reliability spec. Alternatively, if outside of range during testing, then the IC may be considered a "FAIL".

FIG. 4 is substantially similar to FIG. 3 except for the reliability spec determination (block 435), reliability testings (blocks 440-449), and corresponding bin distributions according to reliability pass and fail (arrows 460-465, 470-475, 490-495, 499). Accordingly, redundant discussion thereof is omitted for sake of brevity. Testing is again conducted from lowest step voltage to highest to again take advantage of the fact that such testing hierarchy tends to pass/distribute ICs into the lowest (i.e., the most commercially valuable) step (Vcc) voltage.

Similarly, reliability testing is conducted at each step voltage from greatest reliability to lowest to likewise take advantage of the fact that it tends to pass/distribute ICs into FIG. 4's leftmost (most commercially valuable) reliability commercially valuable) bin. That is, the FIG. 4 bins are arranged such that the left-most bin has the highest reliability (most commercial value), whereas the rightward bins have lower and lower reliability (and less and less commercial value).

At the conclusion of testing, there may be an example bin split distribution of the ICs within the bins as shown in parenthesis at the bottom of FIG. 4. That is, while the FIG. 3 example had shown example frequency bin distributions of: BIN1 (6.7%), BIN2 (35.9%), BIN3 (42.1%), BIN4 (14.4%), BIN5 (0.5%), DISCARD (0.4%), FIG. 4 shows reliability bin distributions of BIN1 (11.4%), BIN2 (48.8%), BIN3 (36.6%), BIN4 (2.8%), BIN5 (0.0%), DISCARD (0.4%).

While FIGS. 2-4 shows optimization on a basis of a minimum passing supply voltage, verses maximum frequency or maximum reliability (respectively), practice of embodiments of the present invention is not limited thereto. More particularly, as additional non-limiting/non-exhaustive examples, improved testing embodiments may also or alternatively perform predetermined optimization on a basis of: a maximum passing supply voltage level; a passing supply voltage level expected to provide a greatest reliability of the IC; a passing supply voltage level expected to provide a longest operational life for the IC; a passing supply voltage level providing a maximized reliable operational frequency of the IC; a passing supply voltage level providing minimized power consumption by the IC; a passing supply voltage level providing minimized heat generation by the IC; a passing supply voltage level providing maximized financial profit for the IC; constant total power; constant total reliability.

Practice of embodiments of the present invention is not limited to the exact flow sequence shown/described in FIGS. 2-4 and 6. For example, an IC may be tested at a single predetermined voltage to find a PASSABLE frequency, and then located to the PASSABLE frequency and retested through ones of the stepped voltages in an attempt to optimize the PASS voltage.

Further, practice of embodiments of the present invention is not limited to testing according to stepped voltages. As one non-exhaustive example, it may be possible to test a part at a predetermined single test voltage (e.g., a high Vcc), and measure predetermined parameters (e.g., the max frequency, power and leakage), and then, using a formula based on a process model, calculate a workable (pass) or even optimal operation voltage for that part (for a specific bin and power limit) without trying to test the part in different step test voltages. To verify calculations and the part operation, the part may then be tested at the calculated Vcc and frequency. As to determination of an appropriate formula, since a substantial portion of any IC's internal design/workings typically is maintained as a trade secret, again, determination of a workable formula is most easily/appropriately determinable by those skilled in the art who are most intimately involved with the internal design/workings of that IC, and is well within the purview of such skilled artisans.

As a result of all of the foregoing, it can be seen from any of FIGS. 2-4 that an example embodiment of the present invention is viewable as an inventory of same-batch/same-type ICs having diversely designated operating (Vcc) voltages and/or thermal resistances, and/or diversely designated internal VID voltages programmed therein.

At least a portion (if not all) of the present invention may be practiced as a software invention (e.g., a testing program), implemented in the form of at least one sequence of instructions embodied in at least one machine-readable medium and/or in data signals existing on at least one data signal conductor. The sequence of instructions, when executed, causes a machine (e.g., a testing machine) to effect operations with respect to the invention. With respect to the term "machine", such term should be construed broadly as encompassing all types of machines, e.g., a non-exhaustive listing including: computing machines, non-computing machines, processing machines, communication machines, etc. "Machine-readable medium" includes any physical medium that provides (i.e., stores and/or transmits) information in a form readable by a machine, and should be broadly interpreted as encompassing a broad spectrum of mediums, e.g., electronic medium (read-only memories (ROM), random access memories (RAM), flash cards); magnetic medium (floppy disks, hard disks, magnetic tape, etc.); optical medium (CD-ROMs, DVD-ROMs, etc). "At least one" associated with "machine-readable medium" means that ones of the sequence of instructions may be distributed across diversely-typed and/or geographically displaced mediums.

"Data signals" includes any type of signal that provides (i.e., stores and/or transmits) therein, information in a form readable by a machine, and should be broadly interpreted as encompassing any one or combination of a broad spectrum of signal types, e.g., a non-exhaustive listing including: electrical, optical, acoustical, digital, analog, or other form of propagated signals, etc. "Data signal conductor" includes any viable conductor, e.g., conductive wires, optical (e.g., fiber optic) wires, antennas, etc. "At least one" associated with "data signal conductor" means that ones of the sequence of instructions may be distributed across diversely-typed and/or geographically-displaced conductors.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment or component, it is submitted that it is within the purview of one skilled in the art to effect such feature, structure, or characteristic in connection with other ones of the embodiments or components. Furthermore, for ease of understanding, certain method procedures may have been delineated as separate procedures; however, these separately delineated procedures should not be construed as necessarily order dependent in their performance, i.e., some procedures may be able to be performed: in an alternative ordering; simultaneously; partially overlapping; etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

Non-exhaustive examples of changes/alternatives are given as follows. For example, while testing at 25 mV steps was selected for the step target voltages for the above example embodiments, practice of embodiments of the present invention are by no means limited thereto. In fact, finer granularities (e.g., 12.5 mV) of testing voltage level steps may result in more optimal distributions, and thus, even greater yield/profit/etc. As another example, the above FIGS. 2-4 embodiments stop the testing of an IC immediately upon the occurrence of a first PASS during testing. In contrast, a scope of the present invention may include embodiments which do not immediately pass ICs upon a first PASS, but instead test each ICs at all testing steps to determine all PASSES before deciding into which bin an IC should be distributed. Thus, an IC that might be a borderline pass in one bin, might instead be able to be designated into a bin in which it is a solid pass. Alternatively, if an IC is a pass for multiple bins, it might be able to be designated into the bin that has the lowest inventory.

What is claimed is:

1. A system to sort integrated circuits (ICs) comprising:
a plurality of integrated circuits (ICs);
a tester machine configurable to test the plurality of ICs at a plurality of voltages and a plurality of frequencies, the tester machine to determine if each IC in the plurality of ICs is operable at a voltage and frequency combination within a predetermined set of voltage and frequency combinations based on repeated testing of an IC, wherein to fail operating within a voltage and frequency combination within the predetermined set at a given specification, the IC is to retest at a different combination of voltage and frequency within a different predetermined set of voltage and frequency combinations;
a plurality of bins to receive from the tester machine ICs operable within the set of voltage and frequency combinations, wherein each bin is to receive ICs operable at a particular frequency; and
a discard bin to receive from the tester machine ICs failing to operate at any voltage and frequency combination within any of the sets.

2. The system of claim 1, wherein each repeated test is at a successively lower frequency.

3. The system of claim 1, wherein each repeated test is at a successively higher.

4. The system of claim 1, wherein a bin in the plurality of bins is to receive an IC from the tester machine after the tester machine determines that the IC is operable at any voltage and frequency combination within the predetermined set.

5. The system of claim 1, wherein a bin in the plurality of bins receives an IC from the tester machine after the tester machine determines all operable voltage and frequency combinations within the set of voltage and frequency combinations for the IC.

6. The system of claim 1, wherein the tester machine tests each IC sequentially.

7. The system of claim 1, wherein the tester machine tests a subset of the ICs in parallel.

8. The system of claim 1, wherein, before retesting the IC, the tester machine is to retrieve the failing IC from the discard bin.

9. The system of claim 1, wherein the plurality of ICs comprises of the ICs that have passed a prior visual inspection for mechanical defects.

10. The system of claim 1, wherein the plurality of ICs comprises of ICs selected from the group consisting of: partially processed die stage ICs, pre-packaging die stage ICs, and chip stage ICs.

11. The system of claim 1, wherein the plurality of ICs comprises of ICs selected from the group consisting of: processor IC dies, non-processor IC dies, processor IC chips, non-processor IC chips, processor IC packages, and non-processor IC packages.

12. The system of claim 1, wherein the plurality of ICs includes an IC operable with a voltage regulator module (VRM).

13. The system of claim 1, wherein the tester machine is fully automated.

14. The system of claim 1, wherein the specification is a power specification comprising one of static power, dynamic power and combinations thereof.

* * * * *

UNITED STATES PATENT AND TRADEMARK OFFICE
CERTIFICATE OF CORRECTION

PATENT NO. : 7,233,162 B2  Page 1 of 1
APPLICATION NO. : 11/182649
DATED : June 19, 2007
INVENTOR(S) : Arabi et al.

It is certified that error appears in the above-identified patent and that said Letters Patent is hereby corrected as shown below:

Column 18, at line 26, delete "a successively higher." and insert --the same voltage.--.

Signed and Sealed this

Fourth Day of December, 2007

JON W. DUDAS
*Director of the United States Patent and Trademark Office*